METHOD FOR MAKING SEMI-CONDUCTOR DEVICES

Filed May 1, 1953

INVENTOR.
Dietrich A. Jenny
BY J. L. Whittaker
ATTORNEY

United States Patent Office 2,849,341

Patented Aug. 26, 1958

2,849,341

METHOD FOR MAKING SEMI-CONDUCTOR DEVICES

Dietrich A. Jenny, Princeton, N. J., assignor to Radio Corporation of America, a corporation of Delaware Application May 1, 1953, Serial No. 352,327

12 Claims. (Cl. 148—1.5)

Figure 1:
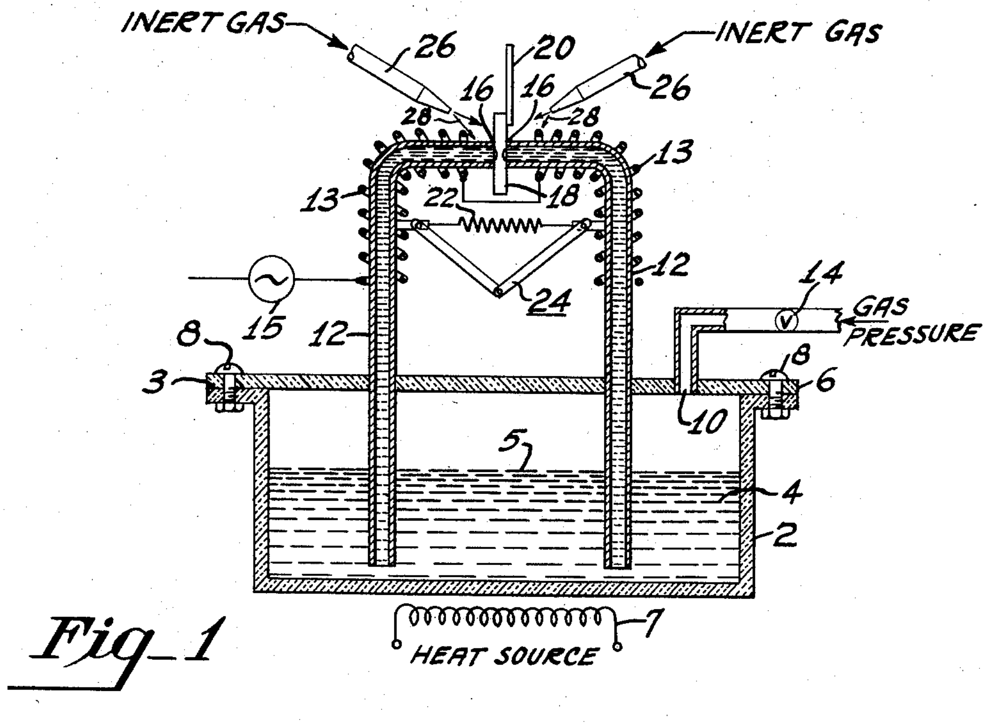

This invention relates broodly to semi-conductor devices and more particularly to a novel method and apparatus for making semi-conductor devices of the type known as alloy-junction transistors.

It is well known to make a transistor by alloying relatively small bodies of an impurity-yielding material into opposite sides of a wafer of a semi-conductive material such as germanium or silicon to form within the wafer two closely spaced, oppositely disposed P–N rectifying junctions. In previous methods of carrying out this process, a relatively small pellet of a selected impurity-yielding material has been placed upon one side of a semi-conductive wafer. The pellet is heated in contact with the wafer to cause it to wet and to adhere to the surface of the wafer. Subsequently a second pellet is placed on the opposite side of the wafer from the first pellet and the entire assembly is heated a second time to melt both the pellets to cause them to alloy with and to diffuse into the wafer, thereby to form P–N rectifying junctions.

Some difficulties have been experienced in producing transistors according to this method, particularly in aligning the two pellets so that P–N rectifying junctions may be formed in accurate co-axial alignment. Further, since the wafers used in making many transistors are often relatively small in size such as about ⅛″ square and since the pellets are generally even smaller such as about 0.1″ to .02″ in diameter, previous methods which involve individual handling of these relatively small parts have proved to be tedious and difficult.

Accordingly, it is an object of the present invention to provide a novel and improved method of making semi-conductor devices.

Another object is to provide a novel and improved method of making alloy junction type transistors.

Another object is to provide a novel and improved method of making an alloy junction type transistor having two P–N rectifying junctions disposed in accurate coaxial alignment.

Another object is to provide novel and improved apparatus suitable for making semi-conductor devices.

Another object is to provide novel and improved apparatus especially adapted for the production of alloy junction type transistors.

Still another object is to provide an improved method of making semi-conductor devices which method does not necessitate the individual handling of bodies of impurity-yielding material that are to be alloyed to a semi-conductive wafer.

The foregoing and other objects may be accomplished according to the instant invention which comprises a novel and improved method and apparatus for forming a semi-conductor device of the alloy junction type. Broadly, the invention provides an improved method and apparatus for producing a semi-conductor device by fusing and alloying a molten mass of an impurity-yielding material into a selected portion of the surface of a body of semi-conducting material.

Figure 2:
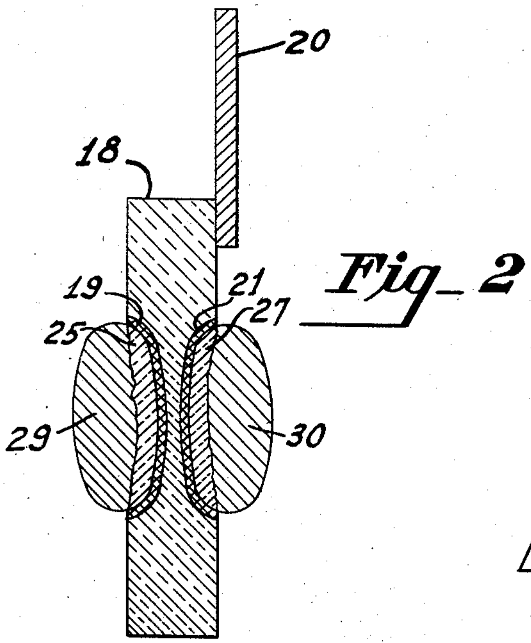

The invention may be more easily understood by reference to the following detailed description and to the drawing of which:

Figure 1 is a schematized, cross-sectional, elevational view of apparatus suitable for the practice of the present invention; and Figure 2 is a schematized, cross-sectional, elevational view of a device produced according to the invention.

Similar reference numerals have been applied to similar elements throughout the drawings.

A transistor may be produced by utilizing a preferred embodiment of apparatus constructed in accordance with the present invention as illustrated in Figure 1 which shows a container 2, which may be of a graphite, in which is disposed a molten mass 4 of an impurity-yielding material such as indium. Any convenient heat source such as the electrical resistance element 7 is provided to heat the impurity-yielding material and to maintain it in a molten state. The container is fitted with a lid 6 which is secured in position by any convenient means such as the bolts 8 and is adapted to provide a reasonably pressure-tight seal along the rim 3 of the container. The lid may be of metal or of any convenient material of sufficient strength and rigidity to bear a moderate gas pressure, for example, about 15 pounds per square inch. The container is provided with a gas inlet means 10 connected to any convenient source of a gas under pressure as indicated by the legend. Preferably the gas should be chemically inert with respect to the molten impurity-yielding material and to the materials of the apparatus. Gases such as argon, nitrogen or hydrogen are generally satisfactory.

A valve 14 is also provided to adjust the gas pressure within the container.

Passageways such as the pair of tubes 12, which may be of any inert refractory material such as graphite or silica, extend through the lid into the molten impurity-yielding material and are bent so that their opposite ends 16 are adjacent and facing each other. The tubes are provided with heating means such as the electrical resistance elements 13 connected to an electrical power source 15 to maintain the impurity-yielding material in a molten state and at a desired temperature when it is driven through the tubes to contact a semi-conductor wafer.

Means such as the spring 22 are also provided to urge the ends 16 of the tubes toward each other, and further means may conveniently be provided such as the toggle 24 to spread the tube ends apart.

Any known means such as the nozzles 26 or a bell jar (not shown) may be employed to provide a non-oxidizing or other special atmosphere in a region surrounding the tube ends 16. If desired the atmosphere may be heated to facilitate the alloying process. Such an atmosphere may be in the form of a flowing stream, as indicated by the arrows 28, or may be quiescent if confined in a chamber. A non-oxidizing atmosphere such as hydrogen, nitrogen or argon is desirable to minimize contamination of the materials being treated and to aid in the production of devices having relatively uniform P–N rectifying junctions.

A wafer 18 of semi-conductive material, such as single crystal N-type germanium, about .005″ thick having a nickel base tab 20 attached thereto by means of a non-rectifying solder connection, is placed between the ends 16 of the tubes. The force exerted by the spring 22 serves to clamp the wafer in position between the tubes. The valve 14 is opened to admit gas under pressure into the container to force the molten impurity material through the tubes and against opposite surfaces of the semi-conductor wafer. The pressure developed within the chamber is not critical, but it should be sufficient to force the molten material through the tubes and to press the material against the wafer with considerable force, for example, about 2 to 15 pounds per square inch, to cause the material to wet and to alloy into the opposite sides of the wafer to form P–N rectifying junctions 19 and 21 within the body of the wafer, as shown in Figure 2.

After about one minute, the valve is closed to release the pressure and to allow the molten impurity material to fall back through the tubes away from the wafer. As the pressure is released, relatively small quantities of the impurity-yielding material freeze upon the opposite surfaces of the wafer forming electrodes thereon. The remainder of the material within the tubes remains liquid and flows back into the container. The tube ends 16 may be drawn apart by the toggle 24 to release the wafer.

The unit made by the above described process is illustrated in Figure 2 and comprises a body 18 of semiconducting germanium of one conductivity type, oppositely disposed zones 25 and 27 of conductivity type opposite that of the remainder of the body and zones 29 and 30 of ohmic conductivity which may serve as emitter and collector electrodes and to which wire leads may be attached. There is thus formed an alloy junction-type transistor which may be conventionally etched, mounted and potted.

The tubes 12 serve not only to conduct the molten material from the container to the wafer but also as masking means to mask portions of the surface of the wafer from contact with the molten material. Thus, the impurity-yielding material is restricted to contact only a selected portion of the surface of the semi-conductor wafer. By aligning the tube ends the areas of contact upon the opposite surfaces of the wafer may likewise be aligned. Since P–N rectifying junctions are formed in the wafer directly beneath the areas of contact it will be seen that accurately aligned junctions may readily be produced by the practice of the invention.

The gas pressure employed may be of any desired degree sufficient to raise the molten material from the chamber to the wafer. However, to provide uniform wetting of the wafer by the material over the entire exposed area and to provide uniform alloying and diffusion of the material into the wafer, it is preferred to employ sufficient pressure to overcome the surface tension forces of the molten material in order to flatten the meniscus so that the molten material contacts the wafer over substanitally the entire area defined by the tube aperture. If less pressure is used, the material may form a curved meniscus and wet initially only a relatively small portion of the desired area, thus producing a P–N rectifying junction of an undesired shape or size.

The heating means, such as the electrical resistance elements 13, adapted to heat the tubes may be adjusted to heat the impurity-yielding material within the tubes to the desired temperature for forming a device. Generally, in the example given wherein indium is fused to a germanium wafer, any temperature between about 250° C. and 925° C. is satsifactory, although a temperature of about 450° C. to 600° C. is preferred. There is an inverse relationship between the temperature used and the time required to produce a satisfactory P–N rectifying junction. If the temperature is too low the process may require an inconveniently long time; if too high the time may be so short that difficulties of control may arise. The preferred temperature range permimts the production of satisfactory P–N rectifying junctions in from about 10 seconds, or less, to about two minutes.

In the production of a transistor such as that heretofore described the thickness of the semi-conductor wafer will also affect the time and temperature requirements, but to only a relatively small extent.

The tubes are provided with heating means in order to permit maintaining the molten mass in the container at a relatively low temperature, such as 150° C. to 200° C. in the case of indium, while providing a relatively high temperature at the tube apertures. Alternatively, the tube heating means may be omitted, and the molten mass in the container maintained at a relatively high temperature. However, for reasons of economy of operation and ease of control it is preferred to provide tube heating means separate from the container heating means.

The internal diameter of the tubes 12 may be selected to control the area of contact upon the surface of the wafer, thereby to control the diameter of P–N rectifying junctions formed according to the invention. By the application of suitable pressure the diameter of a junction so formed may be made closely to approximate the diameter of the tube.

For purposes of illustration only, the two tubes have been shown of the same size; however, it should be understood that the practice of the invention is equally advantageous when employing tubes having different sizes to produce a device having different size electrodes and P–N rectifying junctions.

It should be understood that the invention is not limited to the exact form of apparatus described nor to the production of semi-conductor devices of the materials or configuration described heretofore. The invention is intended to include such modifications as inverting the container and tube apparatus and using vacuum in place of pressure to control the flow of molten material through the tubes. More or fewer than two tubes may be employed to produce a device having more or fewer than two electrodes. Also, any of many known means may be substituted in place of the spring 22 and the toggle 24 to urge the tubes 12 together and to draw them apart such as, for example, a pneumatic piston and drive rod apparatus. It is desirable that the tubes press upon the wafer sufficiently to prevent the escape of molten indium from around the periphery of the tube orifices, although this is not critical since the surface tension of the molten material aids in restraining it. It is also desirable to provide means for controllably spreading apart the tubes after a device is formed between them to allow the device to be removed without damage to the electrodes fused thereon.

Further, the invention is applicable to the production of semi-conductor devices of other materials than germanium and indium. For example, wafers may alternatively comprise other materials such as silicon of either P-type or N-type conductivity, and the impurity-yielding material may comprise any of a relatively large number of other materials or alloys such as gallium, thallium or aluminum which yield P-type impurities, or arsenic or antimony which yield N-type impurities.

There have thus been described a novel and improved method and apparatus for making alloy junction type semi-conductor devices which method is particularly suitable to making alloy junction transistors having accurately aligned oppositely disposed P–N rectifying junctions.

What is claimed is:

1. A method of making a semi-conductor device comprising placing a molten mass consisting essentially of an impurity material capable of imparting to a particular semi-conductive material characteristics of one conductivity type, in contact with a body of said semi-conductive material of opposite conductivity type, said semiconductive material being selected from the group consisting of germanium and silicon, thereby to alloy a portion of said mass into said body and to form a P–N rectifying junction within said body.

2. A method of making a P–N rectifying junction comprising applying material capable of imparting to a particular semi-conductive material characteristics of one conductivity type, in a molten state to a body of said semiconductive material of opposite conductivity type, said semiconductive material being selected from the group consisting of germanium and silicon, thereby to alloy said material into said body and to form a P–N rectifying junction within said body.

3. A method of making a semi-conductor device comprising placing a molten mass consisting essentially of a conductivity type-determining type material of one type in contact with a selected portion of a surface of a body of a semi-conductive material of the opposite conductivity type, said semiconductive material being selected from the group consisting of germanium and silicon, to fuse said type determining material to said surface, thereby to form a P–N rectifying junction within said body.

4. The method according to claim 3 in which said impurity-yielding material is indium.

5. The method according to claim 4 in which said semi-conductive material is N-type germanium.

6. The method according to claim 3 conducted in a non-oxidizing atmosphere.

7. The method according to claim 3 in which said impurity-yielding material is contacted to said surface under a pressure of about 2 to 15 pounds per square inch.

8. The method according to claim 7 in which the time of said contact under pressure is from about 10 seconds to 2 minutes, after which said pressure is released.

9. A method of making a semi-conductor device comprising masking portions of a surface of a semi-conductor body of one conductivity type, said semiconductive material being selected from the group consisting of germanium and silicon, and placing a molten material consisting essentially of an impurity capable of imparting opposite conductivity type characteristics to said semiconductor, in contact with an unmasked portion of said surface, thereby to cause said molten material to alloy with and to diffuse into said body to form a P–N rectifying junction therein.

10. A method of making a P–N rectifying junction in a body of semi-conductor material of a particular conductivity type, said semiconductive material being selected from the group consisting of germanium and silicon, comprising bringing into contact with a surface of said body an end of a column of molten material containing an impurity substance capable of imparting opposite type conductivity to said semi-conductor, alloying a portion of said molten material into said body thereby forming a P–N rectifying junction within said body, and detaching said column from said alloyed portion.

11. In the manufacture of a semiconductor device, a method of making a rectifying junction in a body of semiconductor material of a particular conductivity type comprising bringing into contact with a portion of a surface of said body, an end of a column of molten material containing an impurity substance capable of determining the conductivity type of said semiconductor material and also capable of dissolving and alloying with said semiconductor material, said contact being made in a non-oxidizing atmosphere, maintaining sufficient pressure on said liquid column so that said liquid uniformly wets the contact area, maintaining said liquid column in contact with said body until said impurity substance penetrates into said body to a desired depth and forms a rectifying junction therein, and thereafter detaching said column from said body.

12. A method of making a semiconductor device comprising masking portions of two opposite surfaces of a semiconductor body of a particular conductivity type so that the unmasked portions are aligned opposite each other, simultaneously bringing into contact with each unmasked portion an end of a column of molten material consisting essentially of an impurity substance capable of imparting opposite conductivity type to said semiconductor body and also capable of dissolving and alloying with said semiconductor body, said contact being made in a non-oxidizing atmosphere, maintaining sufficient pressure on each said liquid column so that said molten material uniformly wets each contact area, maintaining each said column in contact with said body until said impurity substance penetrates into said opposite surfaces of said body to a desired depth and forms a rectifying junction therein, and thereafter detaching each said column from said body.

References Cited in the file of this patent

UNITED STATES PATENTS

| | | |
|---|---|---|
| 1,803,513 | Stockfleth | May 5, 1931 |
| 2,004,959 | Morin et al. | June 18, 1935 |
| 2,041,848 | Marinsky | May 26, 1936 |
| 2,209,882 | Galloway | July 30, 1940 |
| 2,210,544 | Galloway | Aug. 6, 1940 |
| 2,449,952 | Pridham | Sept. 21, 1948 |
| 2,560,594 | Pearson | July 17, 1951 |
| 2,602,763 | Scaff et al. | July 8, 1952 |
| 2,629,672 | Sparks | Feb. 24, 1953 |
| 2,644,852 | Dunlap | July 7, 1953 |
| 2,765,245 | English | Oct. 2, 1956 |
| 2,781,481 | Armstrong | Feb. 12, 1957 |

OTHER REFERENCES

Hall: Physical Review, vol. 80, #3, No. 1, 1950, pages 467 and 468.

Armstrong: Proceedings of the IRE, vol. 40, November 1952, pages 1341 and 1342.